(12) United States Patent
Tung et al.

(10) Patent No.: US 12,374,621 B2
(45) Date of Patent: Jul. 29, 2025

(54) SEMICONDUCTOR STRUCTURE AND METHOD OF MANUFACTURING THE SAME

(71) Applicant: Fujian Jinhua Integrated Circuit Co., Ltd., Quanzhou (CN)

(72) Inventors: Yu-Cheng Tung, Quanzhou (CN); Janbo Zhang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 575 days.

(21) Appl. No.: 17/860,052

(22) Filed: Jul. 7, 2022

(65) Prior Publication Data
US 2023/0253317 A1    Aug. 10, 2023

(30) Foreign Application Priority Data

Feb. 10, 2022    (CN) .......................... 202210125492.1
Feb. 10, 2022    (CN) .......................... 202220270888.0

(51) Int. Cl.
| | |
|---|---|
| H01L 23/528 | (2006.01) |
| H01L 21/311 | (2006.01) |
| H01L 21/3213 | (2006.01) |
| H01L 21/768 | (2006.01) |
| H10B 12/00 | (2023.01) |

(52) U.S. Cl.
CPC .... *H01L 23/5283* (2013.01); *H01L 21/31144* (2013.01); *H01L 21/32139* (2013.01); *H01L 21/76816* (2013.01); *H10B 12/315* (2023.02); *H10B 12/482* (2023.02); *H10B 12/485* (2023.02)

(58) Field of Classification Search
CPC ........... H01L 23/5283; H01L 21/31144; H01L 21/32139; H01L 21/76816
See application file for complete search history.

(56) References Cited

U.S. PATENT DOCUMENTS

| | | |
|---|---|---|
| 9,184,168 B2 | 11/2015 | Ryu |
| 2020/0203215 A1 | 6/2020 | Jang |
| 2022/0068937 A1* | 3/2022 | Ping .................. H01L 21/76877 |

* cited by examiner

*Primary Examiner* — Walter H Swanson
(74) *Attorney, Agent, or Firm* — Winston Hsu (57) ABSTRACT

A semiconductor structure is provided in the present invention, including a substrate with multiple recesses and active areas, multiple bit lines spaced apart in a first direction on the cell region and extending in a second direction perpendicular to the first direction, and the bit line is electrically connected to an active area in the substrate through the recess, and a dummy bit line at an outermost side of the multiple bit lines in the first direction and extending in the second direction, wherein a width of the dummy bit line in the first direction is larger than a width of the bit line in the first direction, and the bit lines and the dummy bit line have the same composition and layer structures.

10 Claims, 14 Drawing Sheets

SEMICONDUCTOR STRUCTURE AND METHOD OF MANUFACTURING THE SAME

BACKGROUND OF THE INVENTION

1. Field of the Invention

The embodiments provided in the present invention relate to a semiconductor structure and method of manufacturing the same, and more specifically, to a semiconductor structure having bit lines with different widths and method of manufacturing the same.

2. Description of the Prior Art

Memory is one type of integrated circuitry and is usually used in computer systems for storing data. Memory may be fabricated in one or more arrays of individual memory cells, which may be written to, or read from, using digit lines (which may also be referred to as bit lines, data lines, or sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory devices may be volatile, semi-volatile, or non-volatile. Non-volatile memory devices can store data for extended periods of time in the absence of power. In contrast, volatile memory would easily dissipate and is therefore needed to be refreshed/rewritten in order to maintain stored data. Component like capacitor is used in memory device to store charges. Memory cells are configured to retain or store data in at least two different selectable states. In a binary system, the states are considered as either a "0" or a "1" logic state, which may be determined through the reading of charges stored in the capacitors to achieve the purpose of storing and accessing data. Electronic component like transistors are also provided in memory device to control the switch of gate and the storing and releasing of the charges. Peripheral circuit region is defined surrounding the array of memory cell in the memory device, with bit lines and word lines extending therethrough from the cell region, and may be further connected to external circuit through interconnects like conductive lines or contacts in the region.

In the manufacture of memory device or other circuit, it is a constancy of purpose in the industry to shrink and integrate components in order to attain higher storage capacity in unit area. However, with constant miniaturization of memory device, many issues encountered in manufacturing processes await to be overcome, such as micro loading effect due to different pattern densities, or insufficient layout area between components in compact space. The motivation of present invention is to overcome the aforementioned issues encountered in the manufacture of circuit.

SUMMARY OF THE INVENTION

The present invention provides a novel semiconductor structure and method of manufacturing the same, featuring the dummy bit line at outermost side with larger width and different spacer forms to solve micro loading effect of the device.

One aspect of the present invention is to provide a semiconductor structure, including a substrate with a cell region define thereon, and the substrate is provided with multiple recesses. Multiple bit lines are spaced apart in a first direction on the cell region and extending in a second direction perpendicular to the first direction, and a dummy bit line at an outermost side of the multiple bit lines in the first direction and extending in the second direction, wherein a width of the dummy bit line in the first direction is larger than a width of the bit line in the first direction, and the bit lines and the dummy bit line have the same composition and layer structures, and a part of the contact layer of the dummy bit line is in one recess and electrically connected to one active area.

Another aspect of the present invention is to provide a method of manufacturing a semiconductor structure, including steps of providing a substrate, wherein a cell region is defined on the substrate, and the substrate is further provided with multiple recesses, forming a bit line material layer on the substrate, forming multiple bit line mask patterns on the bit line material layer, wherein the bit line mask patterns are spaced apart in a first direction on the cell region and extend in a second direction perpendicular to the first direction, forming a photoresist on the bit line mask patterns, wherein the photoresist covers a region outsides the cell region and covers outermost bit line mask pattern in the first direction on the cell region but exposes other bit line mask patterns, and using the photoresist and the bit line mask patterns as an etch mask to etch the bit line material layer, so as to form multiple bit lines and a dummy bit line at an outermost side of the multiple bit lines in the first direction, wherein the bit lines and the dummy bit line extend in the second direction, and the bit line is electrically connected to an active area through one recess, and a width of the dummy bit line in the first direction is larger than a width of the bit line in the first direction, and the bit lines and the dummy bit line have the same composition and layer structures, and a part of the dummy bit line is in one recess and electrically connected to an active area.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Figure 1A:
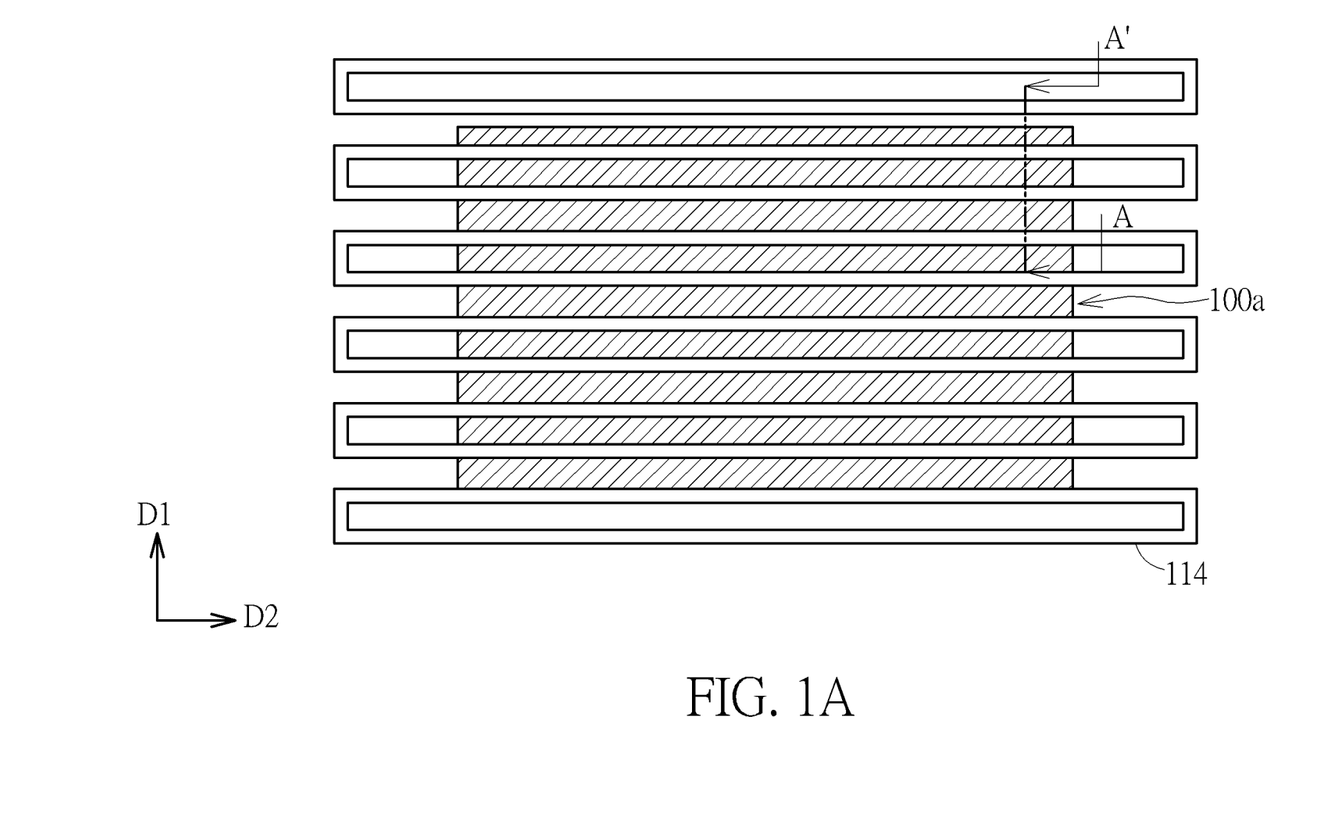
FIG. 1A, FIG. 2A and FIG. 3A are schematic plan views of a process flow of manufacturing the semiconductor structure in accordance with the preferred embodiment of present invention.
Figure 1B:
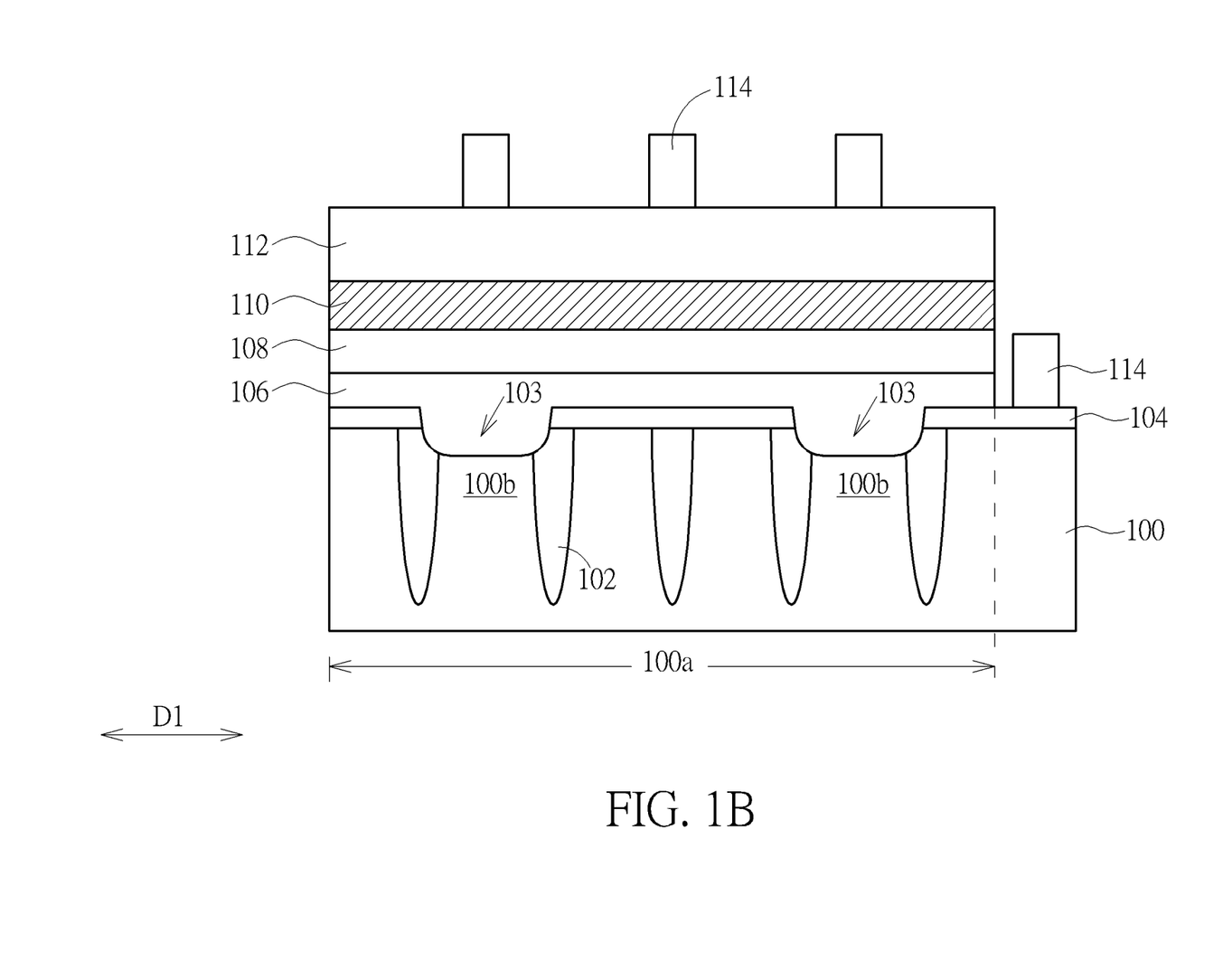
FIG. 1B, FIG. 2B and FIG. 3B are schematic cross-sections of a semiconductor structure taken along the section line A-A' respectively in FIG. 1A, FIG. 2A and FIG. 3A.
Figure 2A:
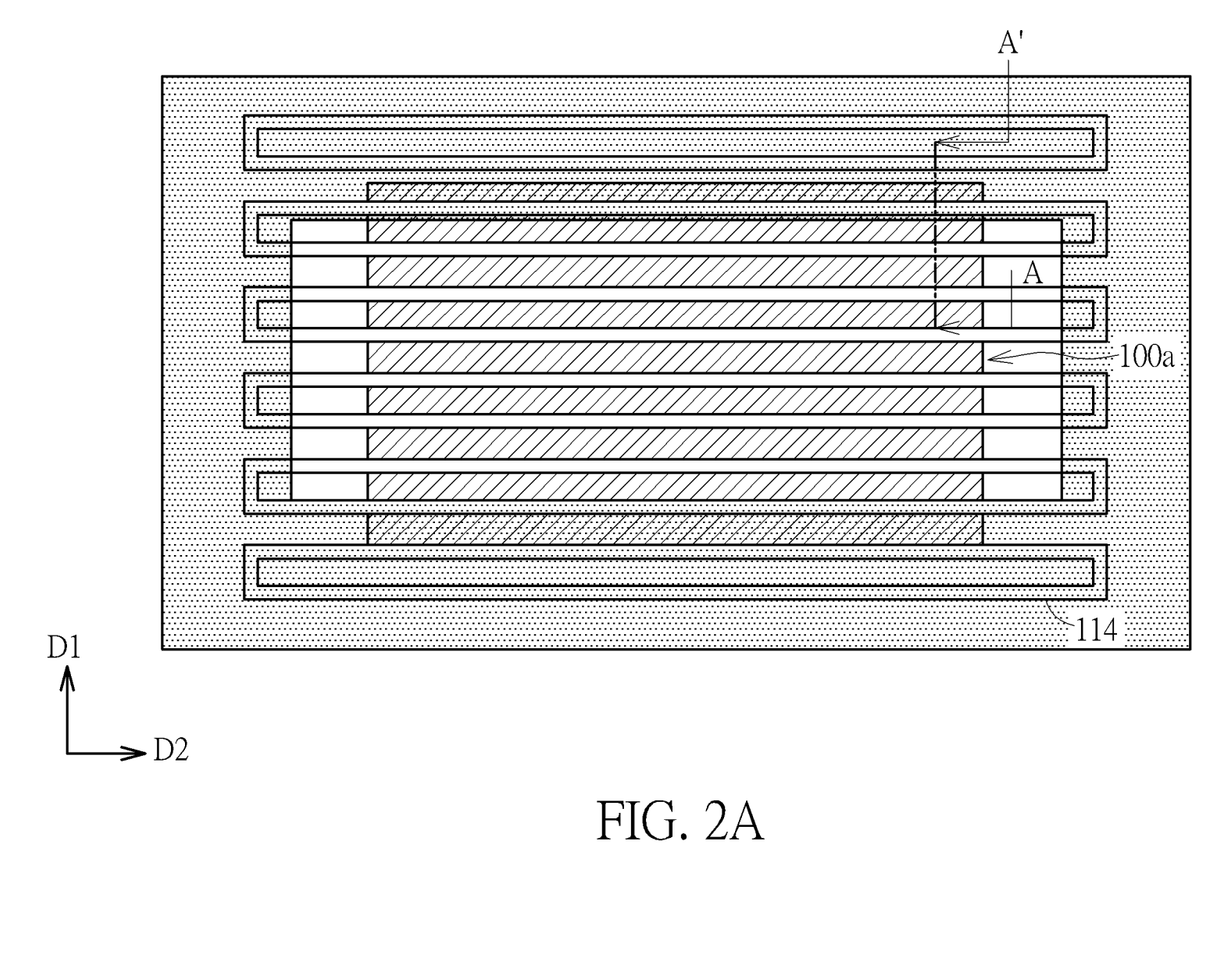
Figure 2B:
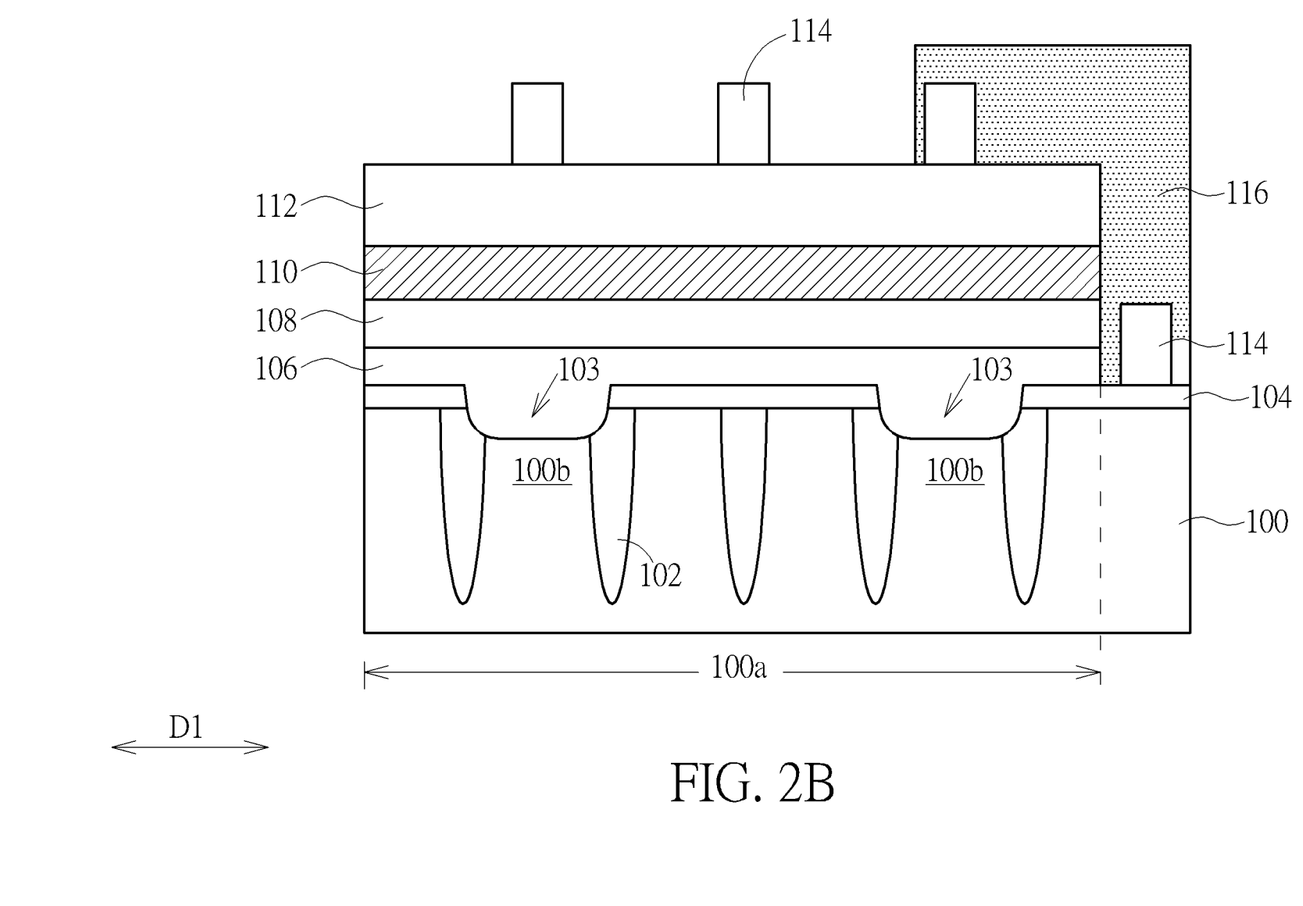
Figure 3A:
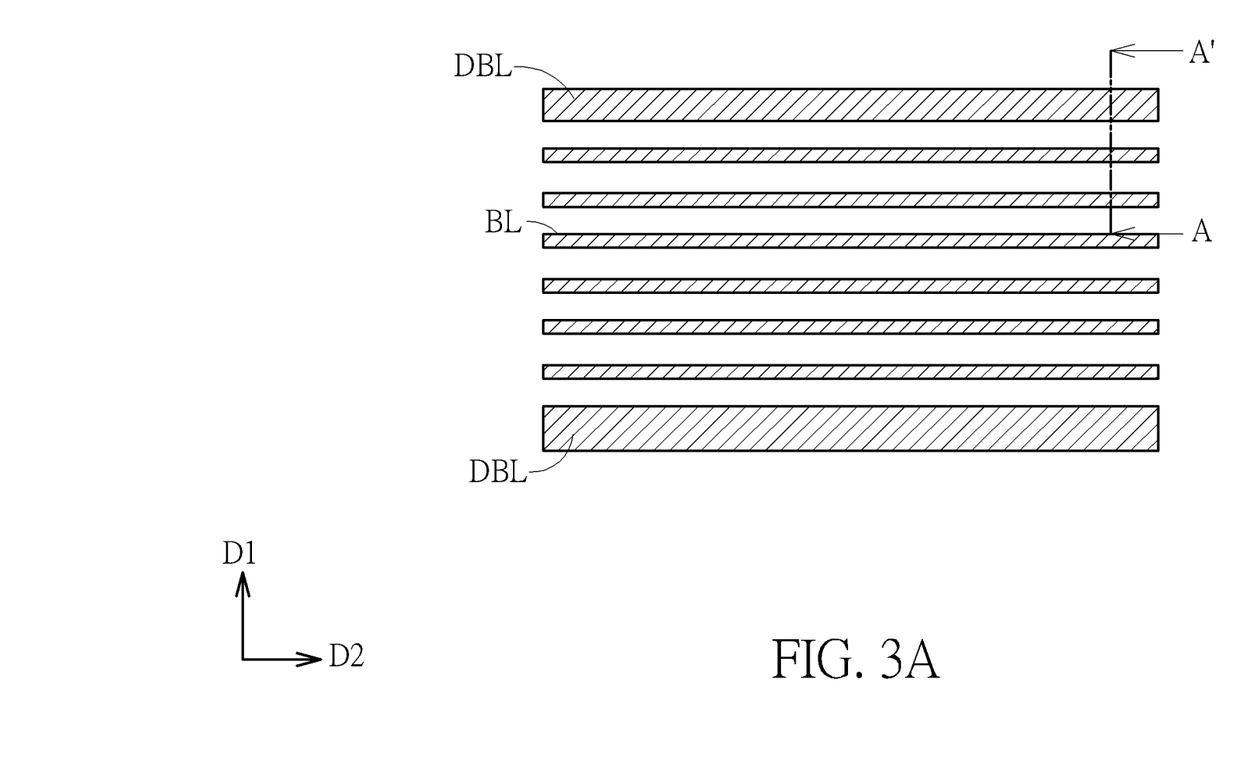
Figure 3B:
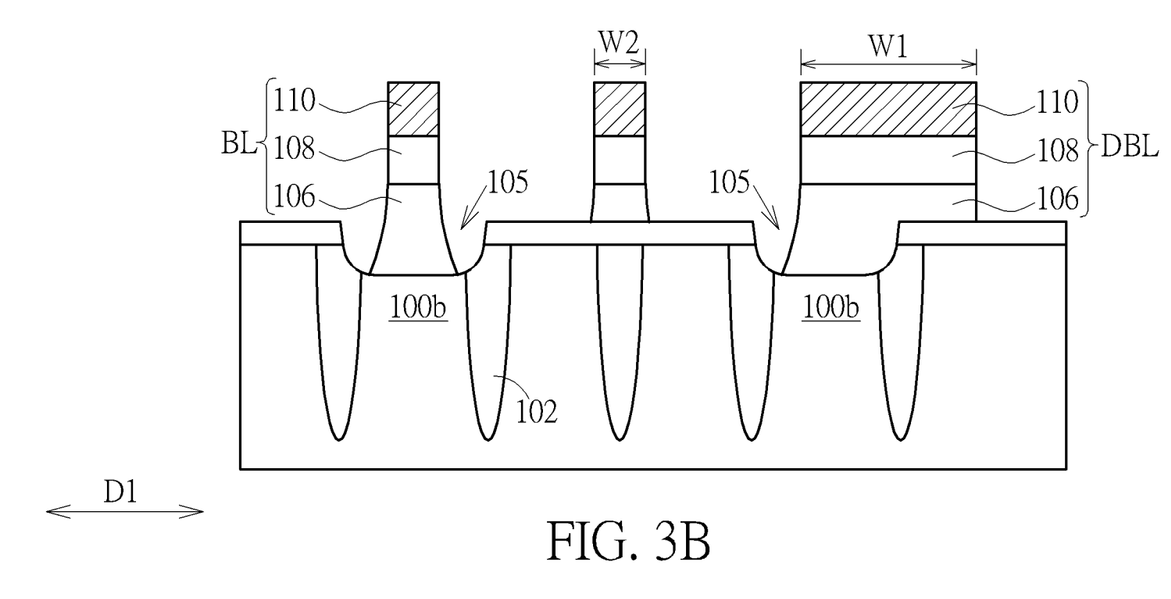

In the drawing of specification, FIG. 1A, FIG. 2A and FIG. 3A are plan views illustrating the process of manufacturing a semiconductor structure in accordance with the preferred embodiment of the present invention, and FIG. 1B, FIG. 2B and FIG. 3B are cross-sections taken along the section lines A-A' respectively in FIG. 1A, FIG. 2A and FIG. 3A, which illustrate the relative positions and connections between components of the present invention in a direction vertical to the substrate.

First, please refer collectively to FIG. 1A and FIG. 1B. The semiconductor structure of the present invention is manufactured on a semiconductor substrate 100, such as a silicon (Si) substrate, germanium (Ge) substrate and/or silicon germanium (SiGe) substrate. A cell region 100a is defined on the semiconductor substrate 100 for the unit cells of semiconductor memory device to be formed thereon. Multiple memory cells may be set in an array on the cell region 100a to store charges and render them in distinctive storage states, thereby achieving the data storage purpose. The cell region 100a may be surrounded by a peripheral region (not shown), which is used to set peripheral circuits of the memory device, such as column decoder, row decoder, sense amplifier or I/O control module. Multiple active areas 100b are defined in the cell region 100a of the semiconductor substrate 100. Active areas 100b are isolated and, therefore, defined by the surrounding device isolating layer 102 like shallow trench isolations (STI). A photolithography process may be performed to the semiconductor substrate 100 in the process to form isolated active areas 100b, and isolating material like silicon oxide is filled in the trench between these active areas 100b to form the device isolating layer 102. An insulating layer 104 is formed on the surface of semiconductor substrate 100 to isolate the components formed thereon from the underlying active areas 100b, and it may functions as a gate dielectric layer for the gates in the peripheral region. The insulating layer 104 may be formed of a single insulating layer or a plurality of insulating layers, such as silicon oxide layer, silicon nitride layer and/or silicon oxynitride layer. Recesses 103 are formed on a number of the active area 100b to make those active areas 100b exposed from the insulating layer 104. Please note that, in actual implementation, the active areas 100b are in a shape of rounded rectangle in the plan view and are provided with major axis extending in the same direction, and they are uniformly distributed in the plan view in a staggered arrangement. For the conciseness of drawings and in case of obscuring the key points of the present invention, FIG. 1A shows only the cell region 100a and the bit line mask patterns 114 formed thereon.

Refer still to FIG. 1A and FIG. 1B. A contact layer 106, a barrier layer 108, a metal layer 110 and a hard mask layer 112 are formed sequentially on the cell region 100a of the semiconductor substrate 100 through an anisotropic photolithography process to define these layer structures on the cell region 100a. The process may also define the gate components in the peripheral region. Preferably, the material of contact layer 106 may be doped polysilicon. The material of barrier layer 108 may be metal nitride like titanium nitride (TiN), tantalum nitride (TaN) and/or tungsten nitride (WN). The material of metal layer 110 may be low-resistance metal like tungsten (W), aluminum (Al), titanium (Ti) or tantalum (Ta). The material of hard mask layer 112 may be silicon nitride ($SiN_x$) or silicon oxynitride (SiON). A part of the contact layer 106 is formed in the recess 103 and is electrically connected with the exposed active area 100b. It can be seen in FIG. 1A that multiple elongated ring-shaped bit line mask patterns 114 are formed on the semiconductor substrate 100. These ring-shaped bit line mask patterns 114 are spaced apart from each other in a first direction D1 and extend in a second direction D2 perpendicular to the first direction D1 through the cell region 100a. Two end of the ring pattern extend outside the cell region 100a. In the cross-sectional view of FIG. 1B, the bit line mask patterns 114 through the cell region 100a are on the hard mask layer 112, and are preferably aligned with a number of the recesses 103 or device isolating layers 102 therebelow. The material of bit line mask pattern 114 may be the material with etch selectivity to the underlying hard mask layer 112, such as silicon nitride, which may be formed through a double patterning process. For example, steps of forming these ring patterns may include: (1) forming multiple sacrificial patterns on a bit line material layer, wherein these sacrificial patterns are spaced apart from each other in the first direction D1 and extend in the second direction D2; (2) forming spacers on sidewalls of these sacrificial patterns; and (3) removing these sacrificial patterns so that these spacers become these ring-shaped bit line mask patterns.

Please refer collectively to FIG. 2A and FIG. 2B. After the aforementioned layer structures and bit line mask patterns 114 are formed, a photoresist 116 for trimming is formed on the bit line mask patterns 114. As shown in FIG. 2A, the photoresist 116 would cover the region outside the cell region 100a, including the two ends of these ring patterns in the second direction D2, and the photoresist 116 would also cover the bit line mask patterns 114 at the outermost sides in the first direction D1 on the cell region 100a but expose the other bit line mask patterns 114 on the cell region 100a. In this way, it can be seen in the figure that parts of the layer structure in the cell region 100a are also covered by the photoresist 116, and those ring patterns exposed from the photoresist 116 become multiple bit line mask line patterns 114 extending in the second direction D2.

Please refer collectively to FIG. 3A and FIG. 3B. After the photoresist 116 is formed, an etch process is performed using the photoresist 116 and the bit line mask patterns 114 as etch masks to remove exposed layer structure, including contact layer 106, barrier layer 108, metal layer 110 and hard mask layer 112, so as to form bit lines BL and dummy bit lines DBL on the cell region 100a. It can be seen in FIG. 3A that, bit lines BL and dummy bit lines DBL are spaced apart in the first direction D1 and extend through the cell region 100a in the second direction D2. Two dummy bit lines DBL are located at the outermost sides of the line patterns in the first direction D1. It can be seen in FIG. 3B that, the dummy bit line DBL and the bit line BL have the same composition and layer structure. The bit lines formed in the process are electrically connected to the underlying active areas 100b through their contact layers 106. The contact layer 106 of bit line BL and dummy bit line DBL in the recess 103 and the sidewall of the recess 103 would form a smaller trench 105. A part of the dummy bit line DBL at the outermost side in the cell region 100a are formed in the recess 103 and electrically connected with the underlying active area 100b. Since the effort of the aforementioned trimming process, the width W1 of the dummy bit line DBL in the first direction D1 is designedly larger than the width W2 of the bit line BL in the first direction D1. The feature of forming dummy bit lines DBL with larger width at the outermost sides of the cell region 100a can help to solve conventional problem of structural deformation or collapse for those bit lines closer to the region boundary due to micro loading effect. Furthermore, the design of dummy bit line DBL formed both on the recess surface and substrate surface at different levels is also beneficial to the stability of outermost dummy bit lines DBL, to make them steady and hard to collapse.

Figure 4:
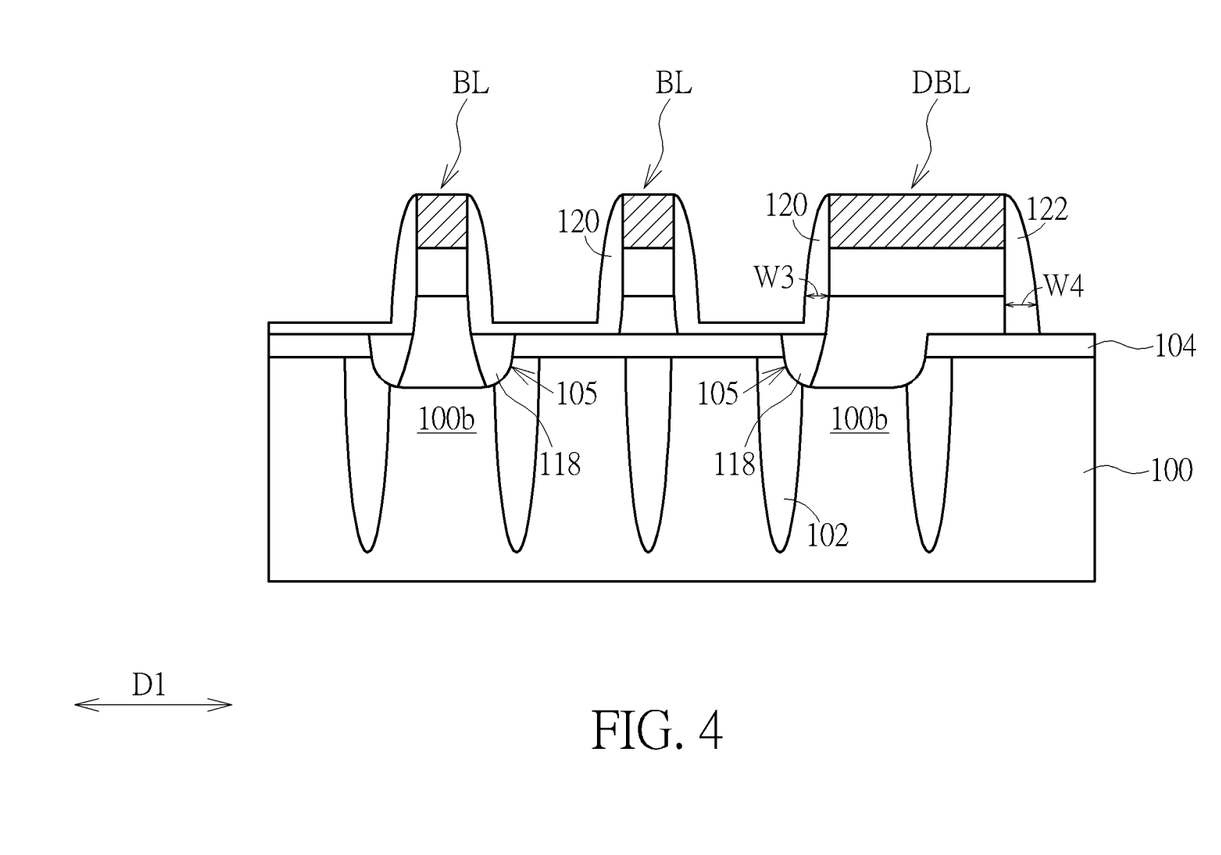
FIG. 4 is a schematic cross-section of a semiconductor structure in accordance with the preferred embodiment of present invention.

Please refer to FIG. 4. After bit lines BL and dummy bit lines DBL are formed, bit line isolations 118 are formed in the trenches 105. The bit line isolation 118 may be formed of insulating material with etch selectivity to the insulating layer 104, such as silicon oxide, silicon nitride, silicon oxynitride or the multilayer structures made thereof. After bit line isolations 118 are formed, spacers 120, 122 are then formed at two sides of the bit lines BL and the dummy bit line DBL, which may be formed through a deposition process and an anisotropic etch process. It can be seen in FIG. 4 that, the width W4 of the spacer 122 in the first direction D1 at outer side of the dummy bit line DBL is larger than the width W3 of the spacer 120 in the first direction D1 at inner side of the dummy bit line DBL and at two sides of the bit lines BL. The spacer 120 at inner side of the dummy bit line DBL would be formed on the bit line isolation 118, and some residue of the deposition layer may remain on the surface of insulating layer 104 to make adjacent spacers 120 connecting each other. The material of spacers 120, 122 may be silicon oxide, silicon nitride or the multilayer structures made thereof.

Figure 5:
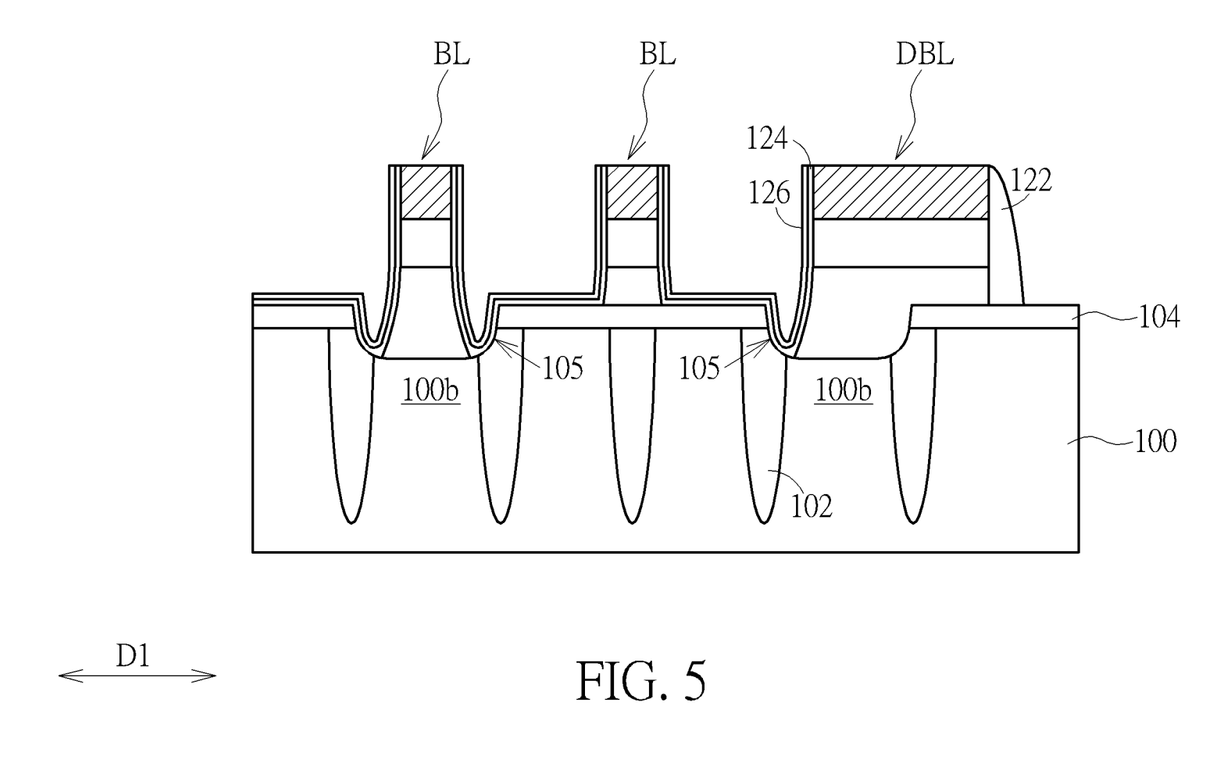
FIG. 5 is a schematic cross-section of a semiconductor structure in accordance with another embodiment of present invention.

Please refer to FIG. 5, which is a schematic cross-section of a semiconductor structure in accordance with another embodiment of the present invention. In addition to the aforementioned spacer forms, other spacer forms may be provided in the present invention. As shown in FIG. 5, in this embodiment, the trench 105 is not filled with bit line isolation 118, and the spacers 120 at inner side of the dummy bit line DBL and at two sides of the bit lines BL may be multilayer structure, including two conformal spacer layers 124, 126 formed conformally along the inner sidewall of the dummy bit line DBL and two sidewalls of the bit lines BL, the surface of trenches 105 and insulating layer 104, while the spacer 122 at outer side of the dummy bit line DBL is a single-layered structure. In other embodiment, the spacer layer 126 may fill up the trenches 105. The material of spacers 124, 126 may be silicon oxide or silicon nitride, respectively. In this embodiment, bottom surfaces of the spacers 122 at two sides of the dummy bit line DBL and the spacers 124, 126 are not on the same level, and the width of the spacer 122 in the first direction D1 is larger than the width of the spacers 124, 126 in the first direction D1.

Figure 6:
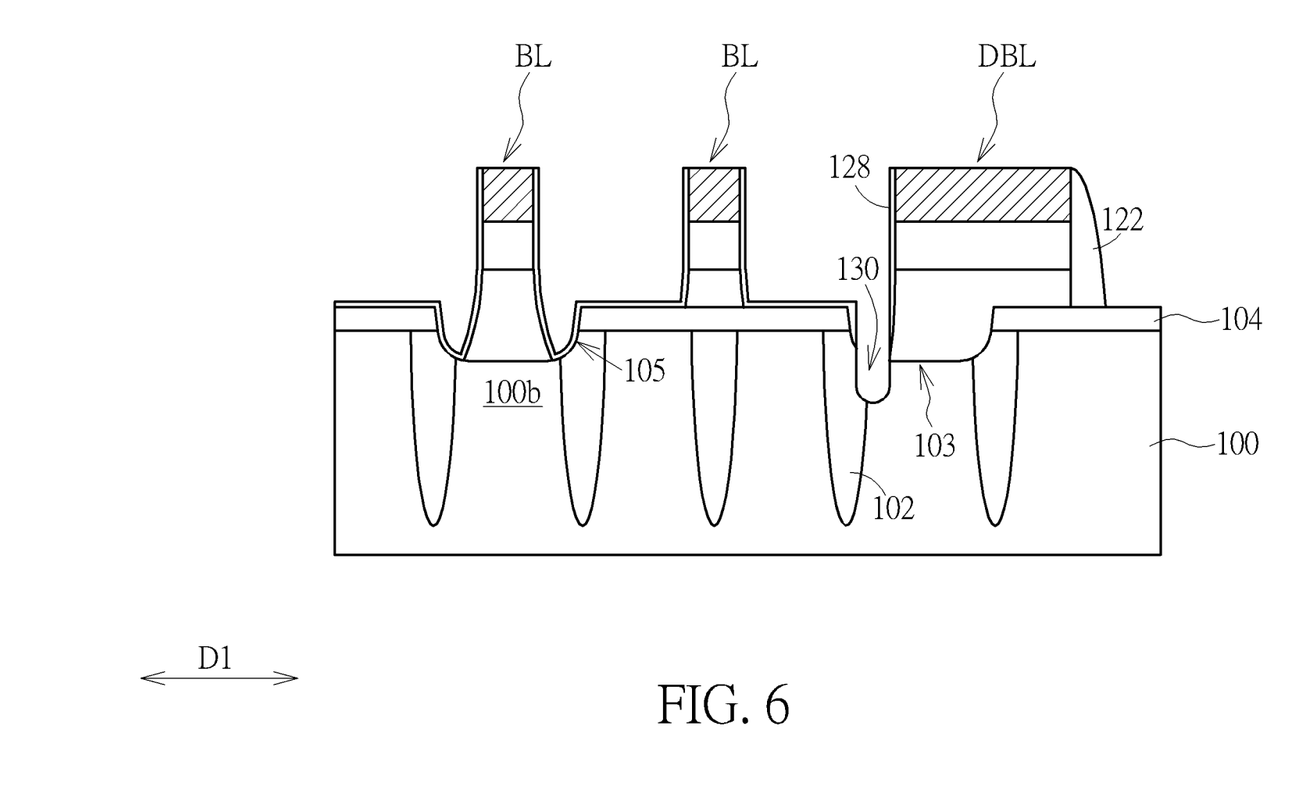
FIG. 6 is a schematic cross-section of a semiconductor structure in accordance with still another embodiment of present invention.

Please refer to FIG. 6, which is a schematic cross-section of a semiconductor structure in accordance with still another embodiment of the present invention, wherein other spacer forms are further provided in the present invention. In the embodiment of FIG. 6, trench 105 is not filled with bit line isolation 118. A spacer layer 128 may be formed first at inner side of the dummy bit line DBL and at two sides of bit lines BL. Thereafter, the original trench 105 is subject to an anisotropic etch process and therefore becomes a trench 130 that is deeper than original recess 103. The advantage of this approach is that it can further improve the isolation between the dummy bit line DBL and adjacent bit line BL.

Figure 7:
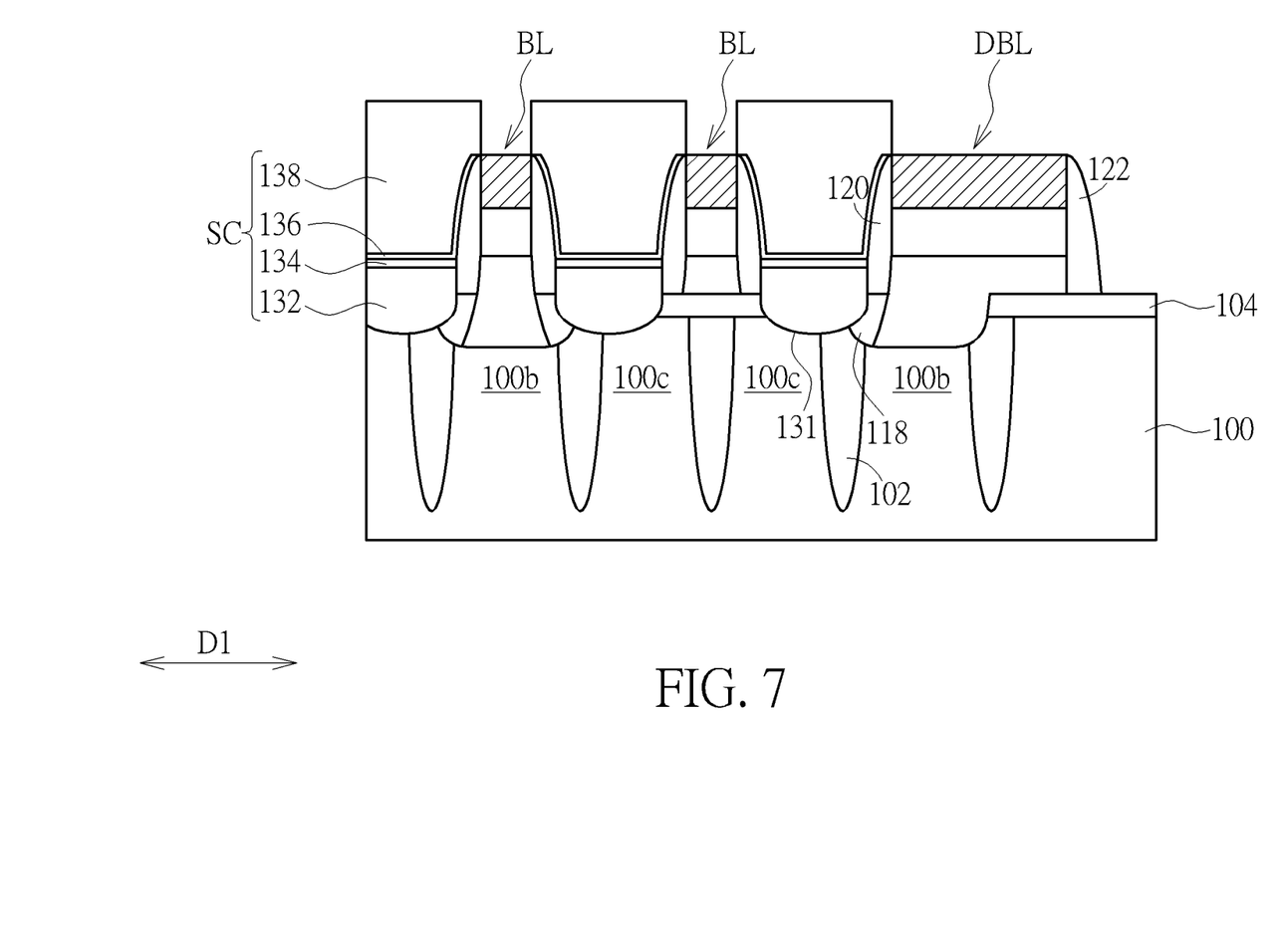
FIG. 7 is a schematic cross-section of a semiconductor structure in accordance with still another embodiment of present invention.

Please refer to FIG. 7, which is a schematic cross-section of a semiconductor structure in accordance with the embodiment of the present invention. After the bit line isolations 118 and spacers 120 are formed, storage node contacts SC are then formed on the active areas 100c between the bit lines BL, with steps may including forming spacer structures (not shown) first between the bit lines BL, then using a photoresist, the spacer structures and the bit lines BL as etch masks to perform an anisotropic etch process to remove the insulating layer 104 between the spacer structures and the bit lines BL and expose underlying active areas 100c as contact areas 101 for storage nodes to be formed thereon. This etch step may remove parts of the bit line isolations 118 and the active areas 100c, and please note that the region outsides the cell region 100a (ex. the region at outer sides of the dummy bit line DBL) is protected by the photoresist and is not etched. After the contact areas 131 are formed, storage node contacts SC are then formed on the contact areas 131, which may include a polysilicon layer 132, a silicide layer 134, a barrier layer 136 and a metal layer 138 as shown in the figure. The polysilicon layer 132 may be doped polysilicon, which directly contacts the contact area 131 exposed from the substrate. The silicide layer 134 may include titanium silicide, cobalt silicide, nickel silicide, tungsten silicide, platinum silicide and/or molybdenum silicide, etc. The metal layer 138 may be tungsten, aluminum, titanium or tantalum. The barrier layer 136 may be nitride of metal materials like tungsten, aluminum, titanium or tantalum. After the storage node contacts SC are formed, contact isolations are further formed above the storage node contacts SC and charge storage elements like capacitors are formed connecting with the storage node contacts SC. Since these components are not the key point of the present invention, for the conciseness of drawings, they will not be shown in following figures.

Figure 8:
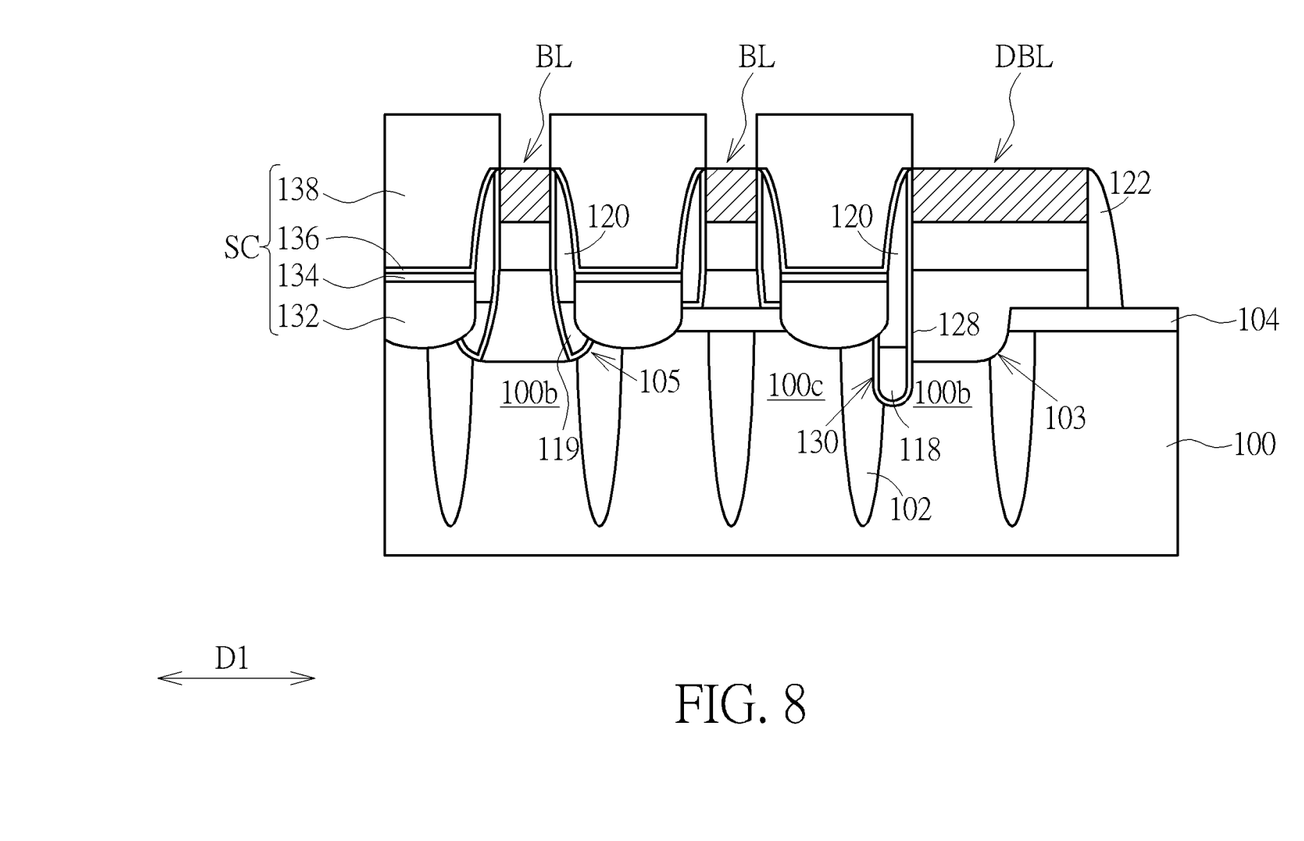
FIG. 8 is a schematic cross-section of a semiconductor structure in accordance with the preferred embodiment of present invention.

Please refer to FIG. 8, which is a schematic cross-section of a semiconductor structure in accordance with the embodiment of the present invention. The structure of this embodiment is similar to the one of FIG. 7, with the difference that FIG. 8 follows the structures of FIG. 6 and illustrates the step of forming storage node contacts SC on the active areas 100c between the bit lines BL. It can be seen in the figure that the depth of trench 130 at inner side of the dummy bit line DBL is lower than the depth of recess 103 where the dummy bit line DBL located and lower than the depth of trench 105 where the bit lines BL located. The trench 130 and the trench 105 are both formed with bit line isolations 118, 119. Please note that in this embodiment, since the trenches 130 is lower, the top surface of the bit line isolation 118 in the trench 130 is lower than the top surface of the bit line isolation 119 in the trench 105. Bit line isolations 118, 119 may be formed of insulating material with etch selectivity to the insulating layer 104, such as silicon oxide, silicon nitride, silicon oxynitride or the multilayer structures made thereof. After the bit line isolations 118, 119 are formed, additional spacers 120 are then formed at two sides of the bit lines BL and the dummy bit line DBL, with material like silicon oxide, silicon nitride or the multilayer structures made thereof. Since the top surface of bit line isolation 118 is lowered, the bottom surfaces of spacers 120, 122 at two sides of the dummy bit line DBL would not be on the same level. Since a spacer layer 128 is further formed on the surfaces of the inner sidewall of the dummy bit line DBL and on the surface of the trenches 130, the spacer layer 128 and the spacer 120 function collectively as a multilayer spacer structure, while the spacer 122 at outer side of the dummy bit line DBL is a single-layered structure. Thereafter, the storage node contact SC process as described in FIG. 7 is performed to form storage node contacts SC on the active areas 100c between the bit lines BL and the dummy bit line DBL. The advantage of this embodiment is that deeper trench 130 can further improve the isolation between the dummy bit line DBL and adjacent bit line BL.

Figure 9:
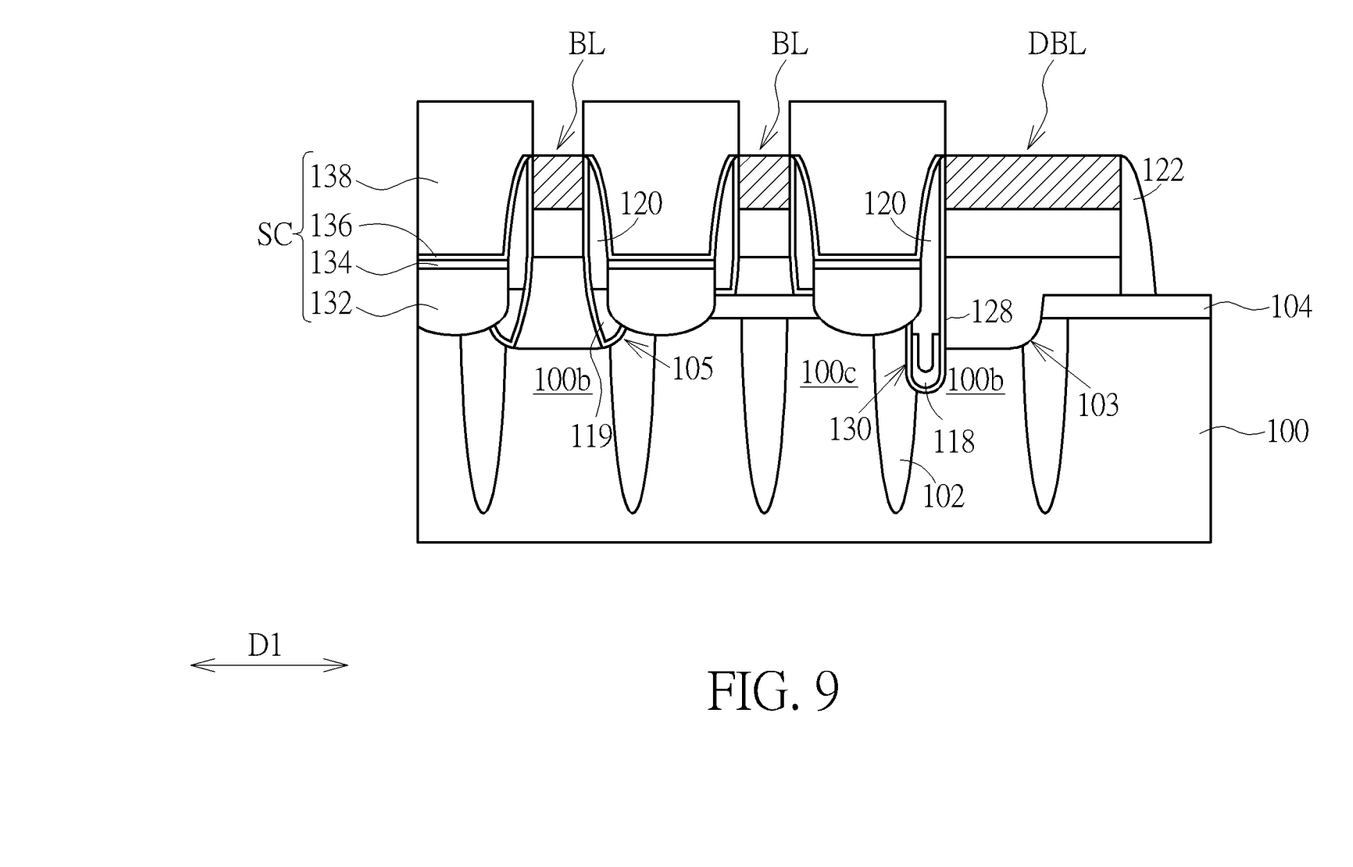
FIG. 9 is a schematic cross-section of a semiconductor structure in accordance with another embodiment of present invention.

Please refer to FIG. 9, which is a schematic cross-section of a semiconductor structure in accordance with another embodiment of the present invention. The structure of this embodiment is similar to the one of FIG. 8, with differences that the bit line isolation 118 formed in the trench 130 in FIG. 9 is not designedly filled up the trench 130, instead, it is formed conformally in the trench 130. A part of the spacer 120 would extend into the bit line isolation 118. Similarly, in this embodiment, the topmost surface of the bit line isolation 118 in the trench 130 is lower than the top surface of the bit line isolation 119 in the trench 105.

Figure 10:
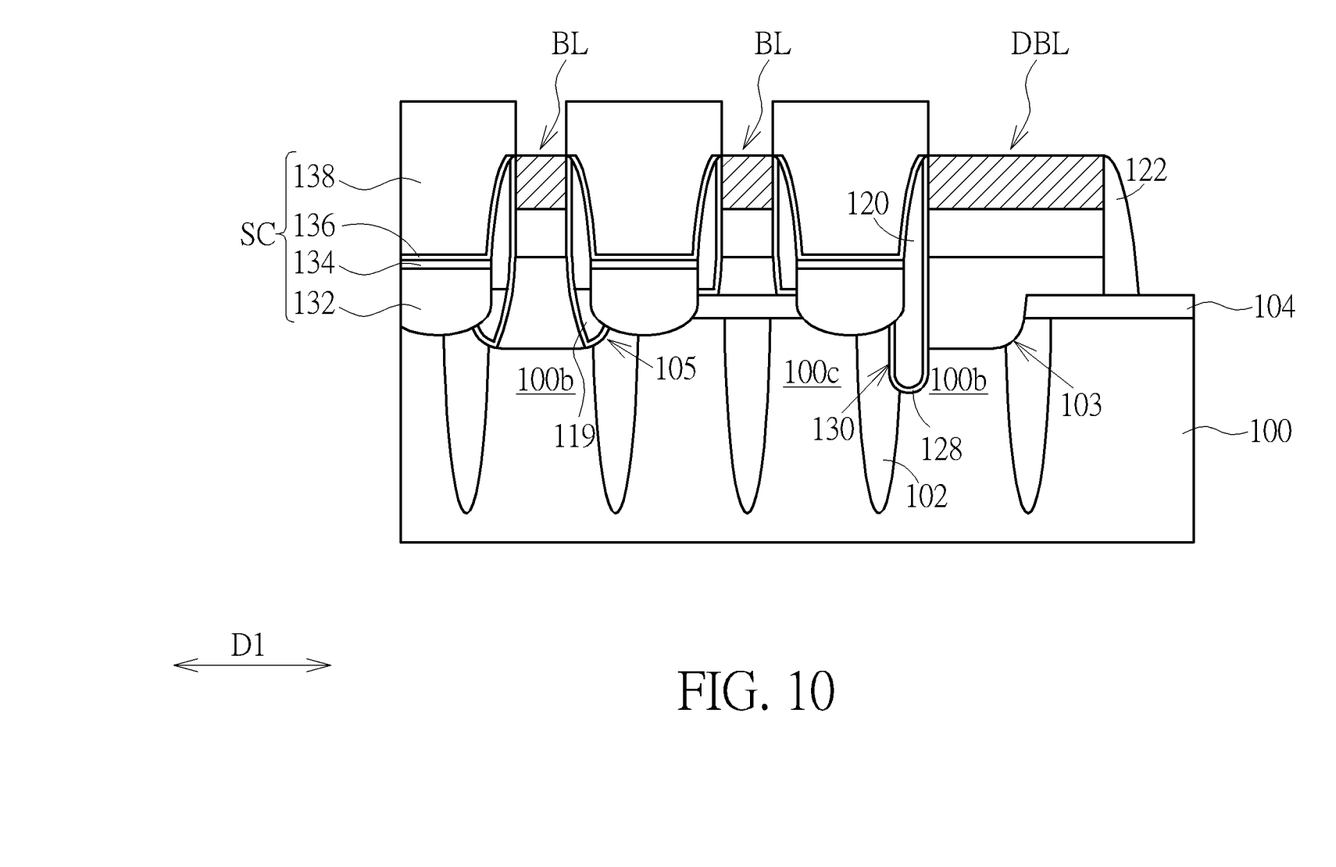
FIG. 10 is a schematic cross-section of a semiconductor structure in accordance with still another embodiment of present invention.

Please refer to FIG. 10, which is a schematic cross-section of a semiconductor structure in accordance with still another embodiment of the present invention. The structure of this embodiment is similar to the one of FIG. 8, with differences that bit line isolation 118 is not formed in the trench 130 in FIG. 10. The spacer 120 formed thereafter would fill up entire trench 130 directly along the sidewall of the dummy bit line DBL, while the bit line isolations 119 are formed in the trenches 105 at two sides of the bit lines BL.

Figure 11:
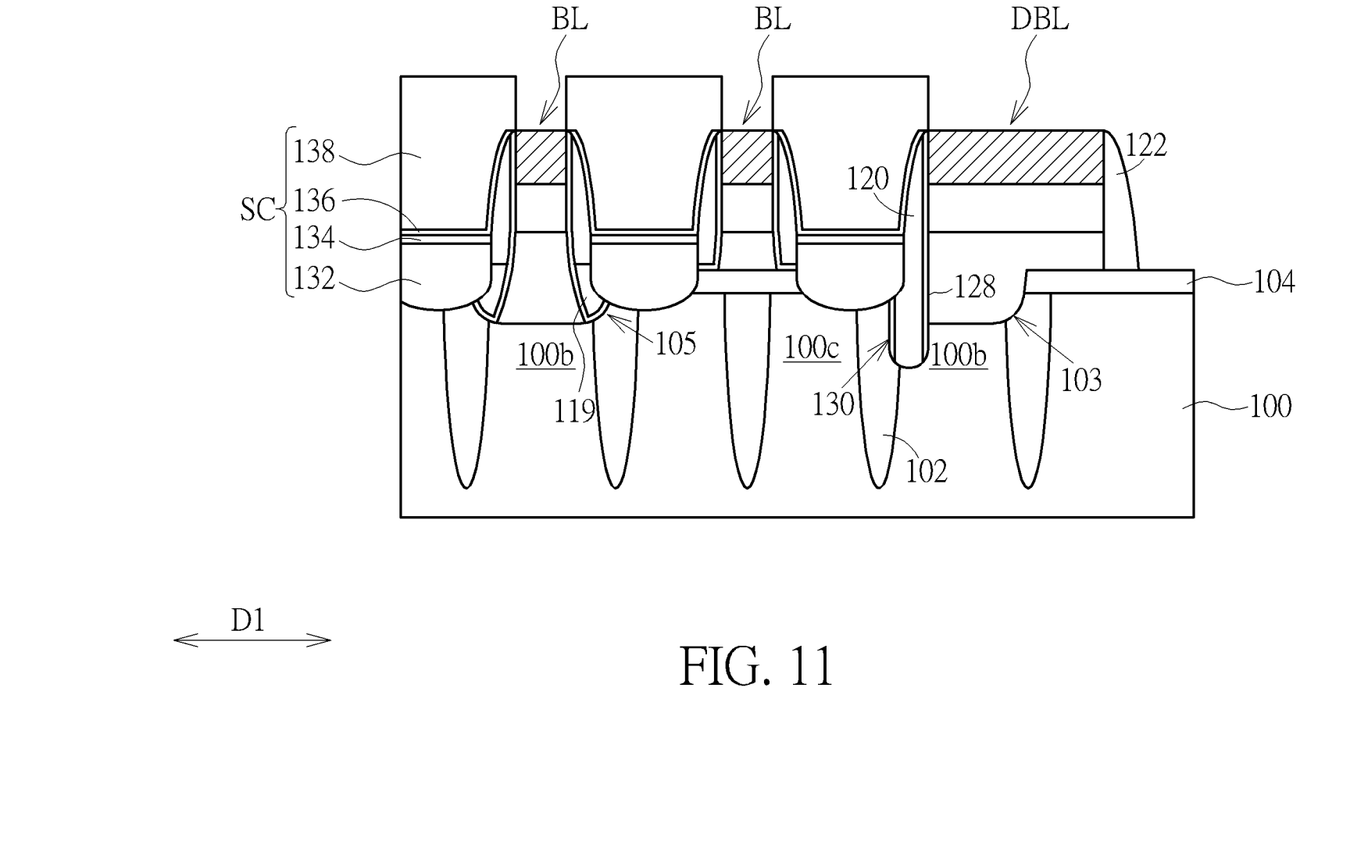
FIG. 11 is a schematic cross-section of a semiconductor structure in accordance with still another embodiment of present invention.

Lastly, please refer to FIG. 11, which is a schematic cross-section of a semiconductor structure in accordance with still another embodiment of the present invention. The structure of this embodiment is similar to the one of FIG. 10, with differences that the spacer layer 128 once conformally formed on the surface of trench 130 in FIG. 11 does not completely cover the surface of trench 130. Due to anisotropic etching, a part of the spacer layer 128 on the bottom surface of the trench 130 is removed to expose the active area 100b. In this way, the spacer 120 formed thereafter would fill up entire trench 130 directly along the sidewall of the dummy bit line DBL and directly contact the exposed active area 100b.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate with a cell region define thereon, and said substrate is provided with multiple recesses and active areas;
   multiple bit lines spaced apart in a first direction on said cell region and extending in a second direction perpendicular to said first direction; and
   a dummy bit line at an outermost side of said multiple bit lines in said first direction and extending in said second direction, wherein a width of said dummy bit line in said first direction is larger than a width of said bit lines in said first direction, and said bit lines and said dummy bit line have the same composition and layer structures, comprising a contact layer, a conductive layer and a hard mask layer sequentially from said substrate, wherein said contact layer of a bit line of said bit lines is in a recess of said recesses and electrically connected to an active area of said active areas through said recess and forms a first trench collectively with a sidewall of said recess, and a part of said contact layer of said dummy bit line is in another recess of said recesses and electrically connected to another active area of said active areas and forms a second trench collectively with a sidewall of said recess.

2. The semiconductor structure of claim 1, wherein a depth of said first trench is the same as a depth of said recess, and a depth of said second trench is deeper than the depth of said first trench.

3. The semiconductor structure of claim 2, wherein a conformal spacer layer is formed on sidewalls at two sides of said bit lines, on a sidewall at an inner side of said dummy bit line, on surfaces of said first trench and said second trench, and further comprising spacers formed on the sidewalls at the two sides of said bit lines and at two sides of said dummy bit line.

4. The semiconductor structure of claim 3, wherein a spacer of said spacers is at the sidewall at the inner side of said dummy bit line, passes through said spacer layer and directly contacts one underlying active area of said active areas of said substrate.

5. The semiconductor structure of claim 2, said first trench is filled with a first bit line spacer, said second trench is filled with a second bit line spacer, and further comprising spacers formed on sidewalls at two sides of said bit lines, on sidewalls at two sides of said dummy bit line, on said first bit line spacer and on said second bit line spacer.

6. The semiconductor structure of claim 5, wherein a top surface of said second bit line spacer is lower than a top surface of said first bit line spacer.

7. The semiconductor structure of claim 5, wherein said second bit line spacer is conformally formed on a surface of said second trench, and a part of a spacer of said spacers extends into said second bit line spacer.

8. The semiconductor structure of claim 5, wherein a width of a spacer of said spacers in said first direction at an outer side of said dummy bit line is larger than a width of a spacer of said spacers in said first direction at an inner side of said dummy bit line and larger than a width of a spacer of said spacers in said first direction on said bit line.

9. The semiconductor structure of claim 5, wherein bottoms of said spacers at the two sides of said dummy bit line are not on the same level.

10. The semiconductor structure of claim 5, wherein a spacer of said spacers at an outer side of said dummy bit line is a single-layered spacer, and a spacer of said spacers at an inner side of said dummy bit line is a multilayered spacer.

* * * * *